(12) United States Patent
Dewey (10) Patent No.: US 8,125,488 B1
(45) Date of Patent: Feb. 28, 2012

(54) COMPUTER SYSTEM HAVING A COMBINED GPU-VIDEO BIOS PACKAGE

(75) Inventor: Thomas E. Dewey, Menlo Park, CA (US)

(73) Assignee: NVIDIA Corporation, Santa Clara, CA (US)

( * ) Notice: Subject to any disclaimer, the term of this patent is extended or adjusted under 35 U.S.C. 154(b) by 897 days.

(21) Appl. No.: 11/286,965

(22) Filed: Nov. 22, 2005

Related U.S. Application Data (60) Division of application No. 10/666,085, filed on Sep. 19, 2003, now Pat. No. 6,982,490, and a continuation-in-part of application No. 10/197,071, filed on Jul. 16, 2002, now Pat. No. 6,797,998.

(51) Int. Cl.
*G06F 15/00* (2006.01)

(52) U.S. Cl. .................................. 345/519; 345/501

(58) Field of Classification Search .................. 257/203, 257/778, 784; 345/501, 519
See application file for complete search history.

(56) References Cited

U.S. PATENT DOCUMENTS 4,318,173 A    3/1982  Freedman et al.
(Continued)

FOREIGN PATENT DOCUMENTS

WO    2004/008327    1/2004

OTHER PUBLICATIONS

Non-Final OA Dated Oct. 4, 2007; U.S. Appl. No. 10/912,393.
(Continued)

*Primary Examiner* — Allan R. Wilson (57) ABSTRACT

An interface device having a video BIOS component. The device includes a substrate for implementing a mother board connection and implementing a GPU (graphics processor unit) connection. A video BIOS component is mounted on the substrate for providing video BIOS functions for the computer system.

15 Claims, 4 Drawing Sheets

U.S. PATENT DOCUMENTS

| | | | |
|---|---|---|---|
| 4,847,751 A | 7/1989 | Nakade et al. | |
| 5,168,566 A | 12/1992 | Kuki et al. | |
| 5,465,335 A | 11/1995 | Anderson | |
| 5,499,370 A | 3/1996 | Hosaka et al. | |
| 5,701,481 A | 12/1997 | Hosaka et al. | |
| 5,740,183 A | 4/1998 | Lowe | |
| 5,795,297 A | 8/1998 | Daigle | |
| 5,797,003 A | 8/1998 | Voce | |
| 5,918,023 A | 6/1999 | Olson et al. | |
| 5,982,635 A | 11/1999 | Menzies et al. | |
| 6,016,554 A | 1/2000 | Skrovan et al. | |
| 6,018,808 A | 1/2000 | Schieve | |
| 6,285,081 B1 * | 9/2001 | Jackson | 257/738 |
| 6,330,583 B1 | 12/2001 | Reiffin | |
| 6,336,185 B1 | 1/2002 | Sargenti, Jr. et al. | |
| 6,347,394 B1 | 2/2002 | Ochoa et al. | |
| 6,395,995 B1 | 5/2002 | Joy et al. | |
| 6,401,202 B1 | 6/2002 | Abgrall | |
| 6,476,816 B1 * | 11/2002 | Deming et al. | 345/502 |
| 6,477,642 B1 | 11/2002 | Lupo | |
| 6,487,612 B1 | 11/2002 | Sueyoshi et al. | |
| 6,487,656 B1 | 11/2002 | Kim et al. | |
| 6,532,019 B1 | 3/2003 | Gulick et al. | |
| 6,563,299 B1 | 5/2003 | Van Horn et al. | |
| 6,567,880 B1 | 5/2003 | Olarig | |
| 6,570,561 B1 | 5/2003 | Boesch et al. | |
| 6,577,004 B1 | 6/2003 | Rumsey et al. | |
| 6,732,264 B1 | 5/2004 | Sun et al. | |
| 6,757,897 B1 | 6/2004 | Shi et al. | |
| 6,778,390 B2 | 8/2004 | Michael | |
| 6,791,572 B1 | 9/2004 | Cloney et al. | |
| 6,797,998 B2 | 9/2004 | Dewey et al. | |
| 6,892,304 B1 | 5/2005 | Galasso et al. | |
| 6,963,344 B1 | 11/2005 | Kasprzak et al. | |
| 7,051,331 B2 | 5/2006 | Bower, III | |
| 7,149,823 B2 | 12/2006 | Miller et al. | |
| 7,185,189 B2 | 2/2007 | Stevens | |
| 7,296,270 B2 | 11/2007 | Wetzel et al. | |
| 7,296,271 B1 | 11/2007 | Chalmer et al. | |
| 7,634,668 B2 * | 12/2009 | White et al. | 713/300 |
| 7,984,446 B1 | 7/2011 | Lilliebjerg | |
| 2002/0069308 A1 | 6/2002 | Jones et al. | |
| 2002/0188713 A1 | 12/2002 | Bloch et al. | |
| 2003/0065850 A1 | 4/2003 | Saw-Chu et al. | |
| 2003/0135742 A1 * | 7/2003 | Evans | 713/189 |
| 2003/0168738 A1 | 9/2003 | Kabadi et al. | |
| 2004/0010773 A1 | 1/2004 | Chan et al. | |
| 2004/0039954 A1 * | 2/2004 | White et al. | 713/322 |
| 2004/0045003 A1 | 3/2004 | Lake | |

OTHER PUBLICATIONS

Non-Final OA Dated Apr. 21, 2008; U.S. Appl. No. 10/912,393.
Non-Final OA Dated Dec. 5, 2008; U.S. Appl. No. 10/912,393.
Final OA Dated Jun. 5, 2009; U.S. Appl. No. 10/912,393.
Non-Final OA Dated Nov. 10, 2009; U.S. Appl. No. 10/912,393.
Final OA Dated Jun. 29, 2010; U.S. Appl. No. 10/912,393.
Non Final Office Action; Mail Date Jan. 27, 2011; U.S. Appl. No. 10/912,393.

* cited by examiner

COMPUTER SYSTEM HAVING A COMBINED GPU-VIDEO BIOS PACKAGE

This Application is a Divisional Application of commonly assigned, U.S. application Ser. No. 10/666,085, filed Sep. 19, 2003 now U.S. Pat. No. 6,982,490 AN INTERFACE DEVICE INCLUDING A VIDEO BIOS COMPONENT, by Thomas E. Dewey, which is incorporated herein in its entirety.

This application is a Continuation In Part of commonly assigned, U.S. application Ser. No. 10/197,071, filed Jul. 16, 2002 now U.S. Pat. No. 6,797,998 A MULTI-CONFIGURATION GPU INTERFACE DEVICE, by Thomas E. Dewey, et al., which is incorporated herein in its entirety.

FIELD OF THE INVENTION

The field of the present invention pertains to electronic integrated circuits. More particularly, the present invention relates to printed circuit board interfaces.

BACKGROUND OF THE INVENTION

Computer system manufacturers often employ multiple configurations of processors, memory, and motherboards. The different configurations are used to satisfy the different requirements of varying market segments. For example, more powerful systems can include two or more processors and have provisions for a large amount of installed RAM. Similarly, more specialized computer systems can include specialized provisions for special function integrated circuit components, such as graphics accelerators, media processor chips, high-speed input output chips, and the like.

As new configurations of processors, memory, and the like are introduced, computer system manufacturers need to ensure the correct chip set configuration and programming information is incorporated into each new system prior to that system being completed and shipped. Failure to correctly match processor and/or memory configuration with chip set programming can lead to faulty operation, or complete failure, of the computer system.

Configuring chip set programming for computer system graphics processor units (GPUs) can be particularly problematic for computer system manufacturers. GPUs typically have a much greater number of processor type and memory configurations in comparison to the CPU of a computer system. Different versions of a GPU can vary significantly with respect to the capabilities and features implemented. Such variations can include the number and type of integrated circuit dies built within the GPU (e.g., DRAMs, etc.), the type of operations supported by the GPU, and the like. These different versions impact other components which must function with the GPU or CPU. These variations of configuration must be tracked by the computer system manufacturer.

Consequently, tracking GPU configuration to ensure correct BIOS load out is an important task for computer system manufacturers. GPU configuration tracking information must be maintained and used by the manufacturer to ensure the correct chip set programming information is used with a given GPU configuration. For example, different GPU versions function with video BIOS chips (e.g., mounted on the motherboard) in different manners and support different functions and/or features. Consequently, computer system manufacturers must track what type of GPU goes with what type of motherboard, and in turn, is matched with what version of video BIOS (basic input output system) programming and/or what type of video BIOS chip. This added burden of matching components (e.g., GPU version with video BIOS version) and ensuring the correct programming information is loaded into BIOS ROM imposes an additional cost on system manufacturers, and is a significant source of error and unreliability.

Thus what is required is a device that can ensure the correct version of BIOS programming is loaded with a given GPU configuration. What is required is an interface device that eliminates the burden of matching components with different processor versions.

SUMMARY OF THE INVENTION

Embodiments of the present invention provide an interface device including a video BIOS component. Embodiments of the present invention enable the programming of the video BIOS component in accordance with a specific GPU version prior to GPU installation on a motherboard. Additionally, embodiments of the present invention match video BIOS components with specific GPU versions while maintaining a standardized interface for coupling to a printed circuit board.

In one embodiment, the present invention is implemented as an interface device having a video BIOS component. The device includes a substrate for implementing a mother board connection and implementing a GPU (graphics processor unit) connection. A video BIOS component is mounted on the substrate for providing video BIOS functions for the computer system. This aspect allows the video BIOS component to be programmed, for example, by the GPU manufacturer, prior to the build out of a computer system by a board assembler, thereby eliminating any need for the board assembler to track GPU versions in order to program video BIOS components in accordance with specific GPU versions.

In one embodiment, the substrate of the interface device is configured to support a wire bonded attachment to a GPU and the video BIOS component. In another embodiment, a plurality of memory components (e.g., DRAMs chips) are mounted on the substrate with the video BIOS component and a GPU. Additionally, the substrate can support a flip chip mounted GPU.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Embodiments of the present invention provide an interface device including a video BIOS component. Embodiments of the present invention enable the programming of the video BIOS component in accordance with a specific GPU version prior to GPU installation on a motherboard. Additionally, embodiments of the present invention match video BIOS components with specific GPU versions while maintaining a standardized interface for coupling to a printed circuit board. Embodiments of the present invention and their benefits are further described below.

Notation and Nomenclature

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "providing" or "programing" or "processing" or the like, refer to the action and processes of a computer system (e.g., computer system 400 of FIG. 4), or similar electronic computing device, that manipulates and transforms data represented as physical (electronic) quantities within the computer system's registers and memories into other data similarly represented as physical quantities within the computer system memories or registers or other such information storage, transmission or display devices.

Figure 1:
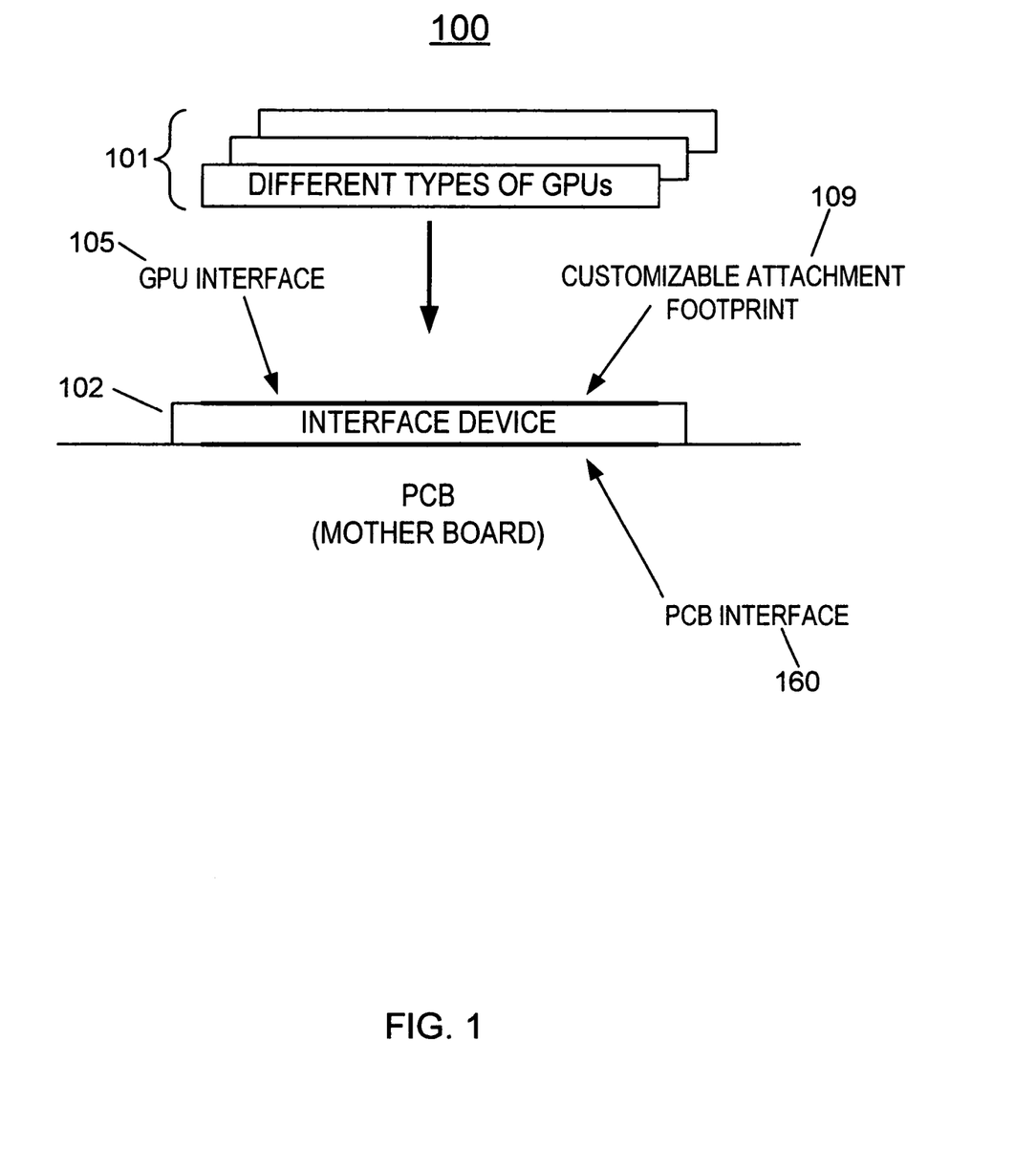
FIG. 1 shows a GPU interface system in accordance with one embodiment of the present invention.

FIG. 1 shows a GPU interface system 100 in accordance with one embodiment of the present invention. As depicted in FIG. 1, system 100 shows a plurality of different types of GPUs 101 using an interface device 102 to couple to a PCB 103.

In the system 100 embodiment, the interface device 102 functions as a multi-configuration interface device for coupling different types of GPUs to a PCB (printed circuit board). The interface device 102 comprises a GPU interface 105 for a connection to the GPUs 101 and a PCB interface 160 for a connection to the PCB 103.

In this embodiment, the GPU interface 105 is implemented using a customizable attachment footprint 109 for effectuating a connection to differing GPU types 101 while maintaining the PCB interface 160 for the connection to the PCB 103. In accordance with the requirements of a GPU type, the customizable attachment footprint can include a solder ball array, an array of contact pads, or the like, arranged in a fashion to support the attachment of the GPU type. The attachment footprint 109 for different GPUs 101 can be configured (e.g., during manufacturing) to respectively support them (e.g., different ball counts, interface configurations, power-ground connections, contact pad geometry, and the like). The interface device 102 maintains a consistent PCB interface 160. Thus, as the characteristics of the different types of GPUs 101 change and evolve, or as different GPU versions 101 are implemented, a consistent connection can be maintained for the PCB via the PCB interface 160. Differing GPU types can be, for example, different types of graphics processor integrated circuits, identical graphics processor integrated circuits and differing amounts of memory, or the like.

Additionally, the interface device embodiments utilize compact and inexpensive attachment footprints (e.g., ball grid arrays, contact pads, etc.) to implement the GPU connection as opposed to prior art socket and slot interconnections. For example, ball grid arrays are more flexible than prior art slot connections or socket connections. For example, the customizable attachment footprint 109 of the present embodiment can accept a surface mounted GPU, substrate mounted GPU, and the like, as described below.

Figure 2:
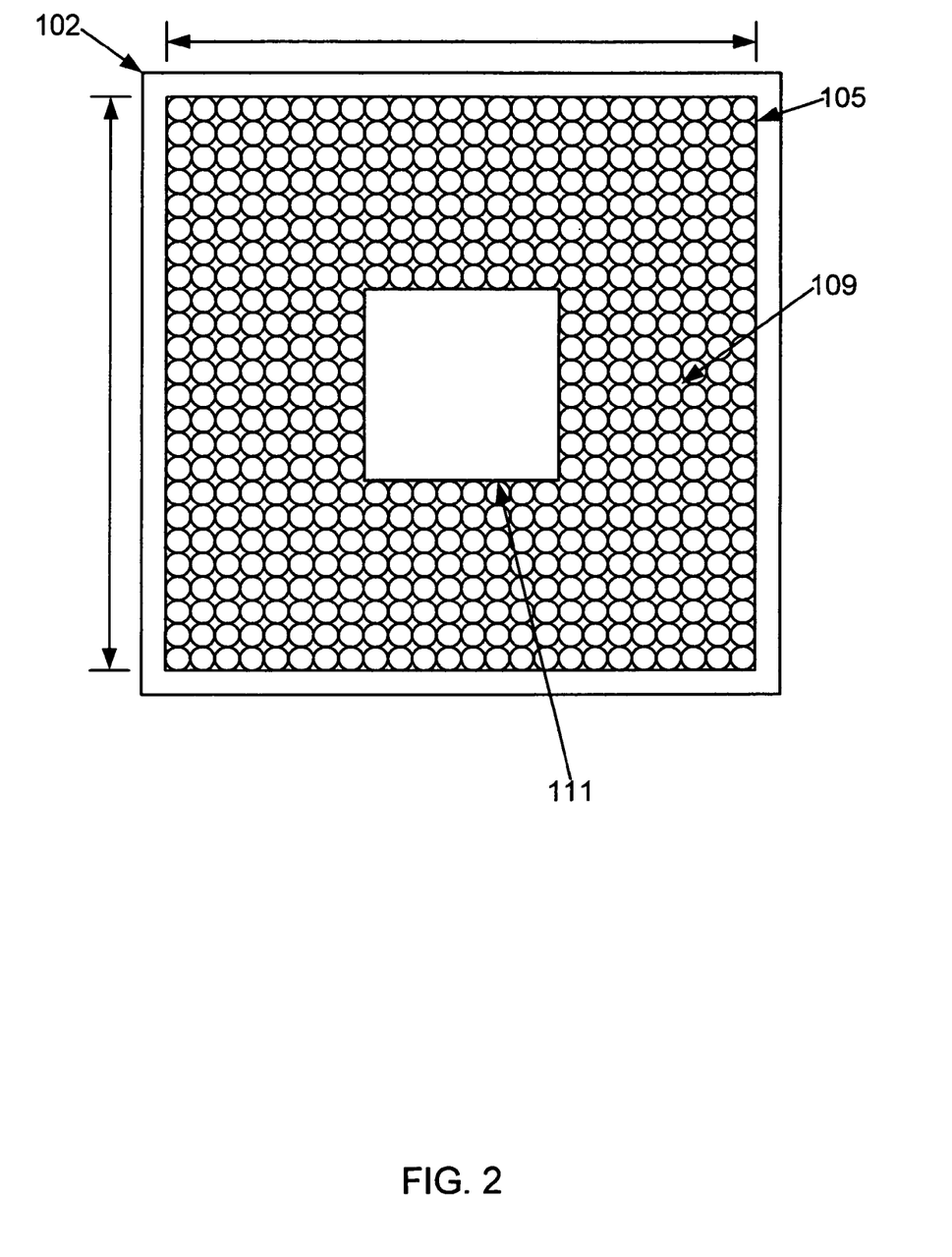
FIG. 2 shows a top-down view of the interface device in accordance with one embodiment of the present invention.

FIG. 2 shows a top-down view of the interface device 102 in accordance with one embodiment of the present invention. As depicted in FIG. 2, the interface device 102 includes the GPU interface 105 having the customizable attachment footprint 109 (e.g., not drawn to scale).

In accordance with differing requirements of different GPU types, the GPU interface 105 is configured to support different means of attachment for a given GPU type. For example, in one embodiment, the GPU interface 105 is configured to support a wire bond attachment to a GPU. In another embodiment, the GPU interface 105 is configured to support a substrate, wherein the substrate includes a mounted GPU in either a surface mounted configuration or a flip chip mounted configuration. In another embodiment, the GPU interface 105 can include a nonfunctional area 111 centrally disposed within the GPU interface 105 to implement either a solder attachment to a surface of a GPU (e.g., a flip chip mounted GPU on a substrate or on the device) or an adhesive attachment.

In a substrate mounted GPU embodiment, the customizable attachment footprint 109 of the GPU interface 105 can be configured to support a plurality of different RAM component configurations (e.g., one, two, four RAM components, etc.) mounted on the substrate in addition to the GPU (e.g., including an additional number of power and ground balls to support the RAM components, voltage reference balls for the RAM components, and the like).

Referring still to FIG. 2, in the present embodiment, the customizable attachment footprint 109 includes a first area located at the center of the customizable attachment footprint 109 (e.g., the balls immediately surrounding the nonfunctional area 111) and a second area disposed around the periphery of the centrally located first area. The balls of the first area include a plurality of thermal balls to support a wire bond attachment to a GPU. The customizable attachment footprint 109 includes a number of ground assignment balls in the signal ball rows (outer 7 rows of the array). The thermal balls in the center area (e.g., the balls immediately surrounding the nonfunctional area 111) are used for the wire-bond versions.

Additionally, the ground to signal ratio among the balls of the customizable attachment footprint 109 is also relatively high, in comparison to prior art, thereby providing improved return paths for high speed signaling. The added number of peripheral ground balls provide a significant advantage to designs where the thermal ground balls in the center of the array (e.g., in the first area) provide both signal interconnections and function as the means of electrical grounding and return paths.

The customizable attachment footprint 109 supports separate power and ground balls for memory and core power. In one embodiment, these balls are primarily disposed in the corners of the customizable attachment footprint 109. In a case where the interface device 102 supports a substrate mounted GPU, this aspect permits the substrate to mount a number of memory components in addition to the GPU (e.g., two or more RAM memory components).

Embodiments of the customizable attachment footprint 109 have sufficient power, ground, and impedance calibration ball assignments to support different versions of the industry standard AGP (accelerated graphics port) interface. For example, the customizable attachment footprint 109 can be configured to support AGP 2×, AGP 4×, or AGP 8× compatible GPUs. Thus, for example, the interface device 102 can readily support a majority of the GPUs being manufactured to function with AGP 4×, and be easily configured to support AGP 8×, or greater, GPU designs when they arrive.

Embodiments of the customizable attachment footprint 109 support ball assignments for the different versions of AGP as described above. Additionally, the customizable attachment footprint 109 can be configured to support dual DACs (to support dual display monitors), digital-video-out (to support digital LCD displays, etc.), TMDS (temperature minimized differential signaling), LVDS (low voltage differential signaling), VIP (video interface port), memory interface (e.g., ROM), and general purpose IOs. Thus, each customizable attachment footprint 109 implementation can be configured to support a number of different subsets of this super-set of GPU interfaces. This allows designers to trade differing degrees of functionality with differing costs and price points.

Additionally, embodiments of the customizable attachment footprint 109 include balls assigned for external frame-buffer clock termination and frame-buffer VREF circuits. Each customizable attachment footprint 109 implementation can choose to connect to these external circuits or not.

It should be noted that although embodiments of the present invention have been discussed in terms a GPU and a GPU interface, embodiments of the present invention are also well-suited to use with a general purpose CPU and CPU interface.

Figure 3:
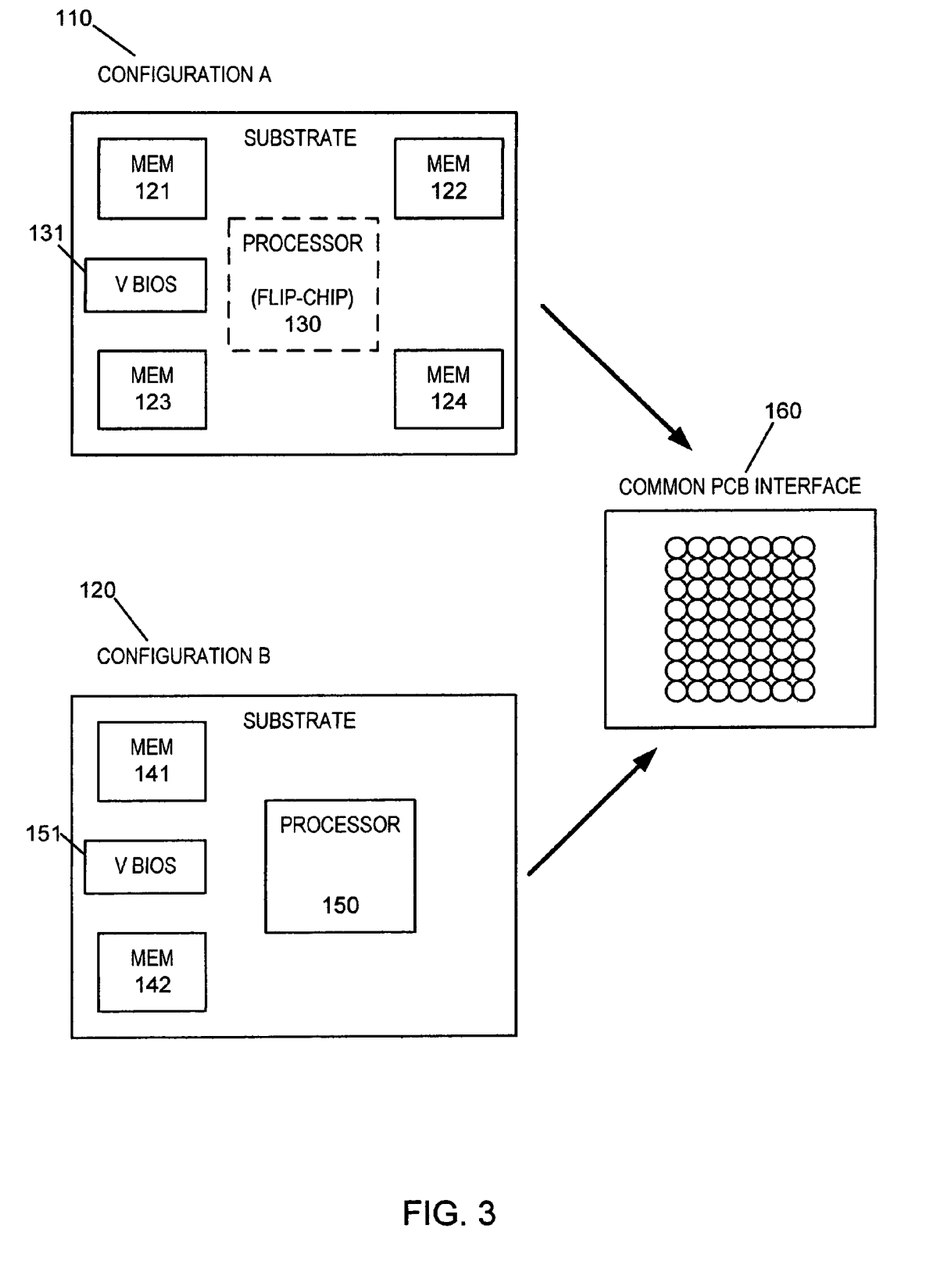
FIG. 3 shows a first configuration and a second configuration of a GPU package device in accordance with one embodiment of the present invention.

FIG. 3 shows a first configuration and a second configuration of a GPU package device in accordance with one embodiment of the present invention. As shown in FIG. 3, a first configuration of the device, configuration A, includes a processor (e.g., GPU) 130 and a plurality of memory components 121-124 mounted on a substrate 110. A second configuration, configuration B, includes a processor 150 and a plurality of memory components 141-142 mounted on a substrate 120. Configuration A and configuration B are both designed to mount on a common PCB interface 160.

In accordance with embodiments of the present invention, configuration A and configuration B both include respective video BIOS components 131-151. Both devices (e.g., device 110 and device 120) depicted in FIG. 3 are implemented as a GPU package device having a GPU and a video BIOS component. The GPU packages include a GPU (e.g., processor 130 and processor 150 respectively) for providing graphics processing for a computer system, in this embodiment, through the common PCB interface 160. Each GPU package itself has an interface for coupling to the common PCB interface 160. Electronic signals from a GPU package communicate with the motherboard of the computer system through the common PCB interface 160. The GPU packages also include a video BIOS component (e.g., a video BIOS chip) for interfacing with the GPU and providing video BIOS functions for the computer system.

Embodiments of the present invention match the video BIOS component with the specific GPU version. Thus, for example, the video BIOS component 131 is programmed specifically in accordance with the components and the configuration (e.g., configuration A) of device 110. Similarly, the video BIOS component 151 is programmed specifically in accordance with the components and configuration (e.g., Configuration B) of device 120. This aspect provides a significant benefit where video BIOS components are matched during manufacture of the GPU package with specific GPU versions. For example, during manufacture, the video BIOS component 131 is recognized, programmed, and included with configuration A while the video BIOS component 151 is recognized, programmed, and included with configuration B. This relieves a computer system manufacturer of the responsibility of tracking which configuration of a graphics package (e.g., GPU package) goes with what configuration of video BIOS component. Additionally, this benefit is provided while maintaining a standardized interface for coupling to a printed circuit board (e.g., through common PCB interface 160).

Referring still FIG. 3, as described above, embodiments of the present invention are well-suited for use with an interface device comprising a configurable substrate that is adapted to support multiple combinations and mounting configurations of processors (e.g., GPUs, DSPs, CPUs, etc.) and memory components (e.g., DDR DRAMs, etc.) while still maintaining a common interface to, for example, an interface area of a printed circuit board (e.g., motherboard, etc.). For example, an interface device comprising the configurable substrate with a mounted video BIOS component can be manufactured such that the interface device will subsequently support many different combinations of GPUs, memory components, and the like, thereby allowing, for example, a GPU manufacter to build multiple configurations of preprogrammed GPU packages using a common interface device. Each of these multiple GPU package types can have their respective video BIOS programmed by the GPU manufacturer as opposed to forcing the GPU version tracking, verification, and programming process on, for example, a board assembler.

As shown in FIG. 3, configuration A has four memory components 121-124, a video BIOS component 131, and a single processor 130. Configuration B has 2 memory components 141-142, a video BIOS component 151, and a single processor 150. Both configurations utilize a common substrate interface that is designed to couple to the common PCB interface 160. It should be noted that embodiments can be configured to support other combinations of memory components and processor (e.g., one processor and one memory component, eight memory components, 16 memory components, etc.).

In one embodiment, the memory components 121-124 and 141-142, and the video BIOS components 131-151 are prepackaged integrated circuit components. As used herein, prepackaged integrated circuit components refer to memory components and video BIOS components that are not bare dies, or raw chips. The components are packaged in the conventional fashion and are tested prior to being mounted on the substrate 110 or the substrate 120. The use of prepackaged pre-tested components increases the yield of the overall device fabrication process in comparison to prior art MCM (multichip module) or MCP (multichip package) devices, which utilize raw chips. Additionally, the use of prepackaged components simplifies their acquisition process. For example: prepackaged components can be purchased from a greater number of vendors, providing better flexibility with respect to price and/or quality.

In the configuration A and configuration B embodiments shown in FIG. 3, the memory components and the video BIOS components are surface mounted on the substrate 110 or 120. In configuration B, the processor 150 is surface mounted on the substrate 120 along with the memory/via BIOS components. In configuration A, the processor 130 is mounted on the substrate 110 in a flip-chip configuration, on the underside of the substrate 110, as shown by the dotted lines showing the outline of the processor 130.

In one embodiment, the processors 130 and 140 are GPUs (graphics processor units). In other embodiments, the processors 130 and 140 are other types of processors, such as, for example, DSPs (digital signal processors), CPUs (central processing units), or the like. Similarly, in one embodiment, the memory components 121-124 and 141-142 are DDR memory components. In other embodiments, the memory components 121-124 and 141-142 are other types of memory components, such as, for example, RDRAM memory components, SDRAM memory components, or the like. In one embodiment, the video BIOS components 131-151 are flash ROMs.

Computer System Platform

Figure 4:
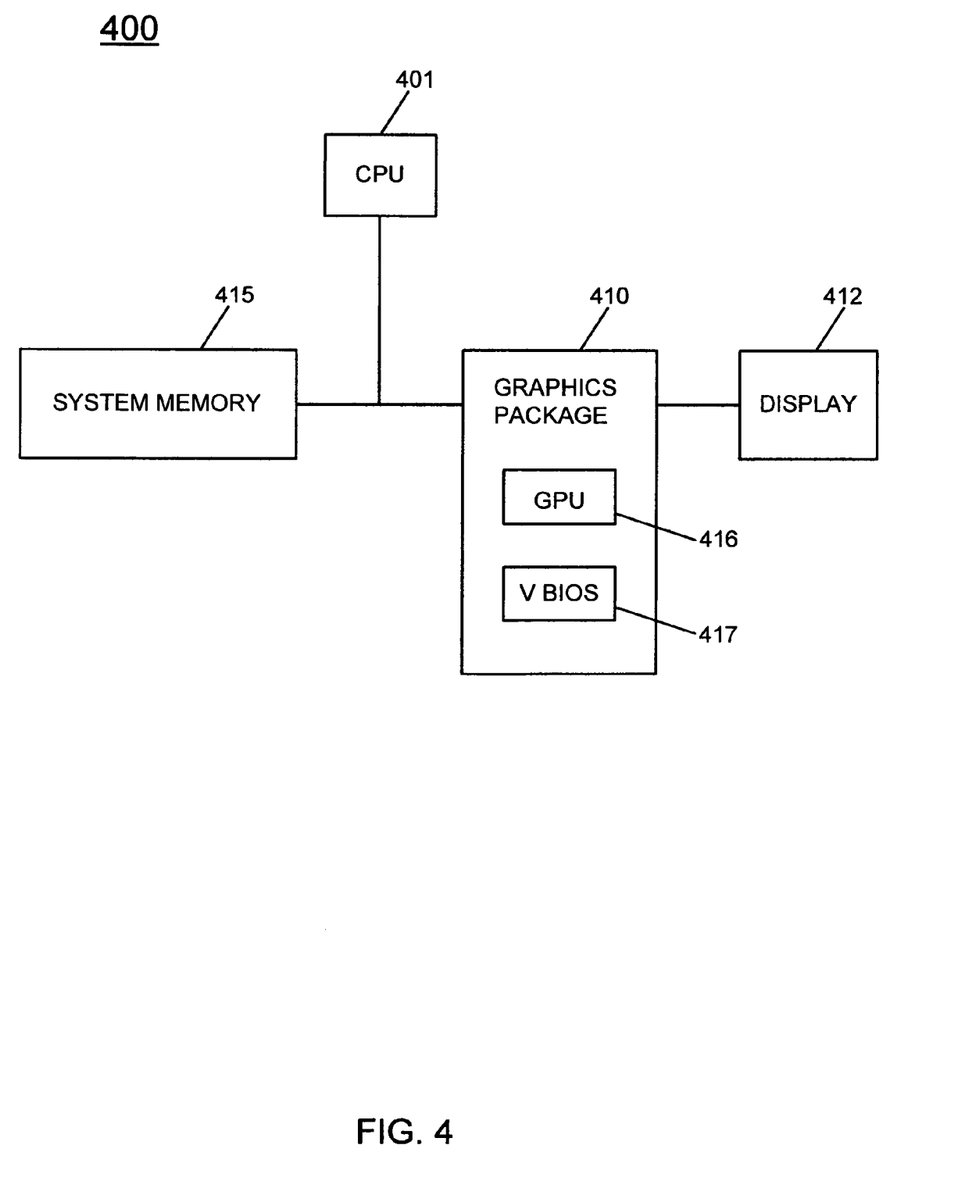
FIG. 4 shows an example of a computer system in accordance with one embodiment of the present invention.

With reference now to FIG. 4, a computer system 400 in accordance with one embodiment of the present invention is shown. Computer system 400 shows the components of a computer system in accordance with one embodiment of the present invention that provides the execution platform for implementing certain software-based functionality of the present invention. As described above, certain processes and steps of the present invention are realized, in one embodiment, as a series of instructions (e.g., software program) that reside within computer readable memory units of a computer system (e.g., system 400) and are executed by the CPU of system 400. When executed, the instructions cause the computer system 400 to implement the functionality of the present invention as described below.

In general, computer system 400 comprises at least one CPU 401 coupled to a system memory 415 and a graphics package 410 via one or more busses as shown. The graphics package 410 is coupled to a display 412. The graphics package 410 includes a GPU 416 for providing graphics processing functions and a video BIOS component 417 for providing video BIOS functions. As shown in FIG. 4, system 400 shows the basic components of a computer system platform that implements the functionality of the present invention. Accordingly, system 400 can be implemented as, for example, a desktop computer system or server computer system, having a powerful general-purpose CPU 401 coupled to a dedicated graphics rendering graphics package 410. In such an embodiment, components would be included that are designed to add peripheral buses, specialized graphics memory and system memory, IO devices, and the like. Additionally, it should be appreciated that although the graphics package 410 is depicted in FIG. 4 as a discrete component, the graphics package 410 can be implemented as a discrete graphics card designed to couple to the computer system via a graphics port (e.g., AGP port, or the like), as a discrete integrated circuit die (e.g., mounted directly on the motherboard), or as an integrated GPU included within the integrated circuit die of a computer system chipset (e.g., integrated within the Northbridge chip). Similarly, system 400 can be implemented as a set-top video game console device such as, for example, the Xbox®, available from Microsoft Corporation of Redmond, Wash.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A computer system having a combined GPU video BIOS package, comprising:
   a motherboard for mounting a plurality of integrated circuit components;
   a GPU package connected to the motherboard;
   a GPU included in the GPU package that provides graphics processor functions for the computer system; and
   a video BIOS chip included in the GPU package that provides video BIOS functions for the computer system, wherein the video BIOS chip is programmed to support a version of the GPU; and
   a substrate that directly mounts the GPU and the video BIOS component.

2. The computer system of claim 1 further comprising:
   an interface that couples to the GPU package and implements a connection between the GPU package and the motherboard.

3. The computer system of claim 1 further comprising:
   a DRAM component mounted on the substrate with the GPU and the video BIOS component.

4. The computer system of claim 1 further comprising:
   a plurality of DRAM components mounted on the substrate, wherein the GPU is mounted in a flip chip configuration.

5. The computer system of claim 1, wherein the video BIOS is programmed for the GPU when the GPU package is manufactured.

6. An electronic device having a combined GPU video BIOS package, comprising:
   an electronic device;
   a GPU package included within the electronic device;
   a GPU integrated circuit die included in the GPU package that provides graphics processor functions for the electronic device;
   a video BIOS integrated circuit die included in the GPU package that provides video BIOS functions for the electronic device, wherein the video BIOS integrated circuit die is programmed to support a version of the GPU integrated circuit die; and
   a substrate that directly mounts the GPU and the video BIOS component.

7. The electronic device of claim 6 further comprising:
   an interface that couples to the GPU package and implements a connection between the GPU package and a printed circuit board.

8. The electronic device of claim 6 further comprising:
a DRAM component mounted on the substrate with the GPU and the video BIOS component.

9. The electronic device of claim 6 further comprising:
a plurality of DRAM components mounted on the substrate, wherein the GPU is mounted in a flip chip configuration.

10. The electronic device of claim 6, wherein the video BIOS is programmed for the GPU when the GPU package is manufactured.

11. A computer system having a combined GPU video BIOS package, comprising:
- a motherboard mounting a plurality of integrated circuit components;
- a GPU package connected to the motherboard;
- a GPU included in the GPU package and providing graphics processor functions for the computer system;
- a video BIOS chip included in the GPU package and providing video BIOS functions for the computer system, wherein the video BIOS chip is programmed to support a version of the GPU; and
- a substrate that directly mounts the GPU and the video BIOS component.

12. The computer system of claim 11 further comprising:
an interface coupling to the GPU package and implementing a connection between the GPU package and the motherboard.

13. The computer system of claim 11 further comprising:
a DRAM component mounted on the substrate with the GPU and the video BIOS component.

14. The computer system of claim 11 further comprising:
a plurality of DRAM components mounted on the substrate, wherein the GPU is mounted in a flip chip configuration.

15. The computer system of claim 11, wherein the video BIOS is programmed for the GPU when the GPU package is manufactured.

* * * * *